(12) United States Patent
Tsai et al.

(10) Patent No.: US 7,891,083 B2
(45) Date of Patent: Feb. 22, 2011

(54) APPARATUS FOR ASSEMBLING SEMICONDUCTOR CHIP MODULE

(75) Inventors: Chun-Chi Tsai, Guangdong (CN); Jian-Hua Xiang, Guangdong (CN); Yao-Zhong Chen, Guangdong (CN)

(73) Assignees: Hong Fu Jin Precision Industry (Shen Zhen) Co., Ltd., Longhua Town, Bao'an District, Shenzhen, Guangdong Province; Hon Hai Precision Industry Co., Ltd., Tu-Cheng, Taipei Hsien (CN)

( * ) Notice: Subject to any disclaimer, the term of this patent is extended or adjusted under 35 U.S.C. 154(b) by 942 days.

(21) Appl. No.: 11/753,579

(22) Filed: May 25, 2007

(65) Prior Publication Data
US 2007/0294882 A1 Dec. 27, 2007

(30) Foreign Application Priority Data
Jun. 21, 2006 (CN) .......................... 2006 1 061245

(51) Int. Cl.
*H05K 13/00* (2006.01)
(52) U.S. Cl. .................. 29/757; 29/243.56; 29/739; 29/758; 29/760
(58) Field of Classification Search .................. 29/739, 29/757, 758, 760, 809, 225, 243.56, 229
See application file for complete search history.

(56) References Cited

U.S. PATENT DOCUMENTS

| 2,707,818 | A | * | 5/1955 | Page ........................... 29/809 |
| 3,430,326 | A | * | 3/1969 | Clark et al. ................... 29/809 |

* cited by examiner

*Primary Examiner*—A. Dexter Tugbang
*Assistant Examiner*—Livius R Cazan
(74) *Attorney, Agent, or Firm*—Winston Hsu; Scott Margo

(57) ABSTRACT

An assembling apparatus is disclosed. The assembling apparatus includes a base, an assembling platform, and a driving part. The assembling platform and the driving part are fixed on the base. The assembling platform defines a receiving space for receiving a semiconductor chip module, a lever chamber for receiving clips of the semiconductor chip module, and a driving groove for connecting the receiving space and the lever chamber. The assembling platform further includes a lever bar removably placed in the lever chamber for expanding the clips. The driving part includes driving shafts. An end of each of the driving shafts is in the driving groove and is movable to pass through the lever chamber and reaches the receiving space. The assembling apparatus is used to assemble a semiconductor chip module conveniently and safely.

7 Claims, 9 Drawing Sheets

APPARATUS FOR ASSEMBLING SEMICONDUCTOR CHIP MODULE

BACKGROUND

1. Technical Field

The present invention relates to an assembling apparatus, and particularly to an assembling apparatus for assembling a semiconductor chip module.

2. General Background

A semiconductor chip, for example, CPU, memory, and so on, produces a lot of heat. If the heat is not removed in time, the semiconductor chip will be destroyed. Radiators are used for eliminating the heat. The radiators are usually made of aluminum. The radiators are attached to the semiconductor chip. Heat transfer sheets are mounted between the semiconductor chip and the radiators for transferring heat efficiently. The semiconductor chip, the heat transfer sheets, and the radiators are fixed by clips and compose a semiconductor chip module.

The semiconductor chip module has many components. It is difficult to assemble the module manually. When assembling the module, electronic components on the semiconductor chip may be carelessly destroyed.

Therefore, what is needed is an assembling apparatus for assembling the semiconductor chip module.

SUMMARY

An assembling apparatus is disclosed. The assembling apparatus includes a base, an assembling platform, and a driving part. The assembling platform and the driving part are mounted on the base. The assembling platform defines a receiving space for receiving a semiconductor chip module, a lever chamber for receiving clips of the semiconductor chip module, and a driving groove connecting the receiving space and the lever chamber. The assembling platform further includes a lever bar removably placed in the lever chamber for expanding the clips. The driving part includes driving shafts. An end of each of the driving shafts is in the driving groove and is movable to pass through the lever chamber and reaches the receiving space.

Further features and advantages will be provided or will become apparent in the course of the following detailed description.

DETAILED DESCRIPTION OF THE EMBODIMENT

Figure 1:
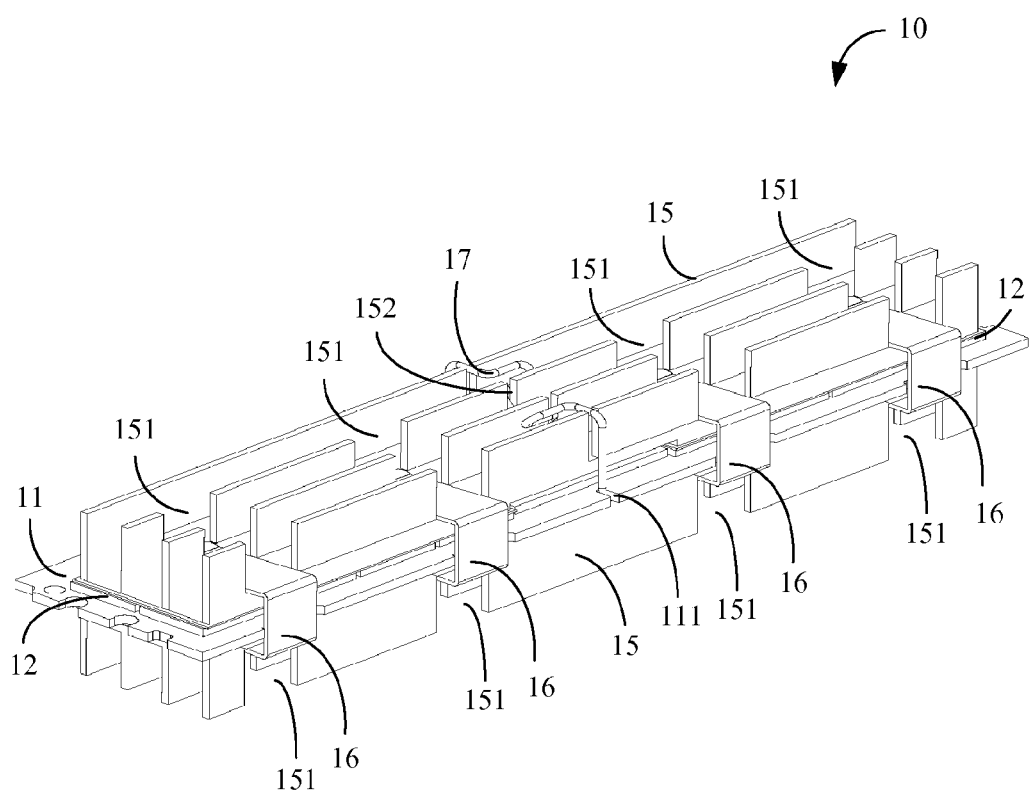
FIG. 1 is a schematic, isometric view of a semiconductor chip module.
Figure 2:
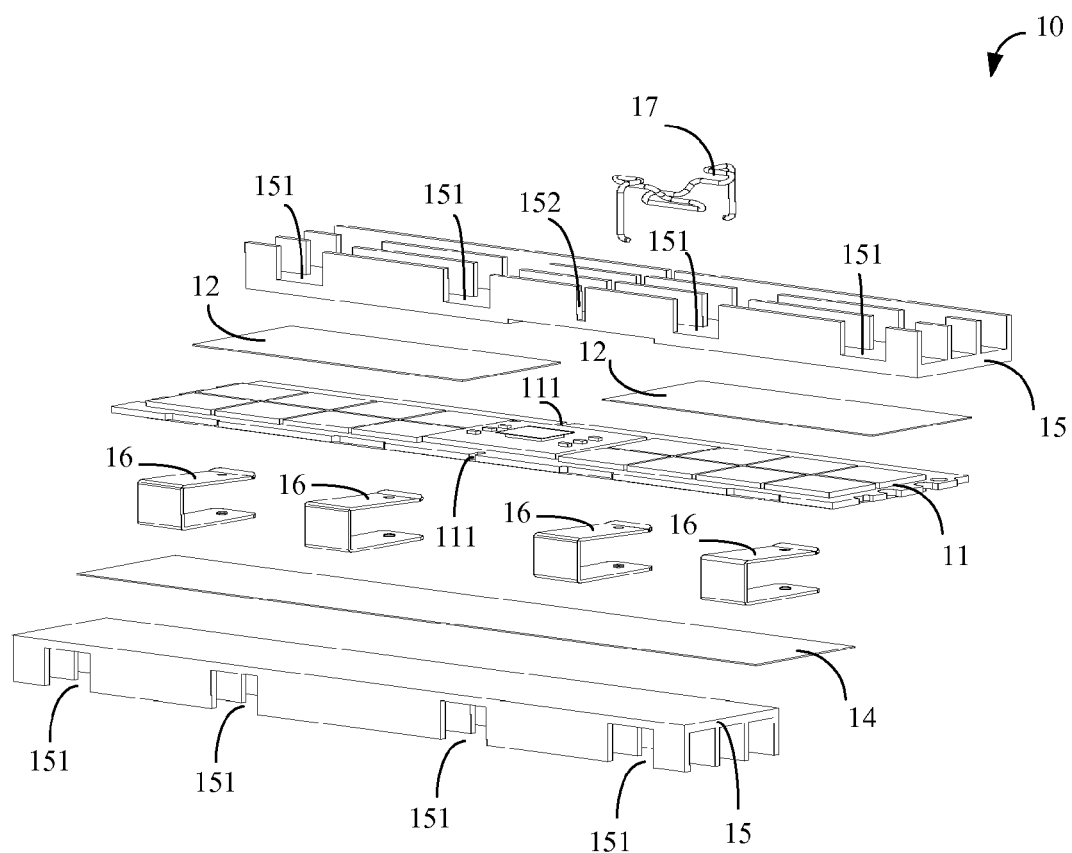
FIG. 2 is an exploded view of the semiconductor chip module of FIG. 1.

Referring to FIGS. 1 and 2, a semiconductor chip module 10 is disclosed. In this embodiment, the semiconductor chip module 10 takes a memory module as an example. The memory module 10 includes a memory chip 11, a plurality of heat transfer sheets 12, 14, two radiators 15, a plurality of clips 16, and a resilient member 17. The memory chip 11 defines two first notches 111 on opposite edges of the memory chip 11. The heat transfer sheet 12 is located on an upper side of the memory chip 11, and the heat transfer sheet 14 is on a lower side of the memory chip 11. The radiators 15 are in direct contact to the heat transfer sheet 12, 14. The radiators 15 define fixing grooves 151, 152. The clips 16 clamp the radiator to the memory along the fixing grooves 151. The resilient member 17 is partially inserted along the fixing groove 152. Two ends of the resilient member 17 are hooked in the first notches 111 so as to fix the memory module 10 horizontally.

Figure 3:
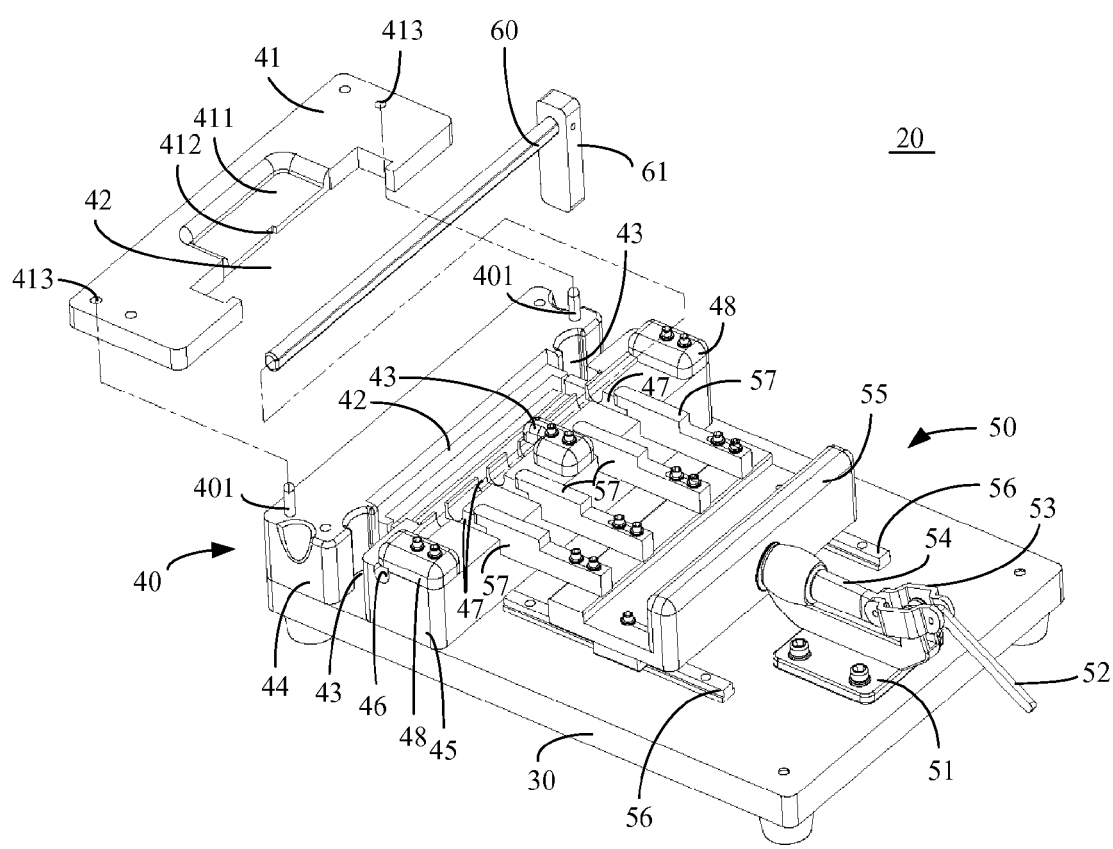
FIG. 3 is a schematic, isometric view of a assembling apparatus used for assembling the semiconductor chip module of FIG. 1, according to a preferred embodiment of the present invention.
Figure 4:
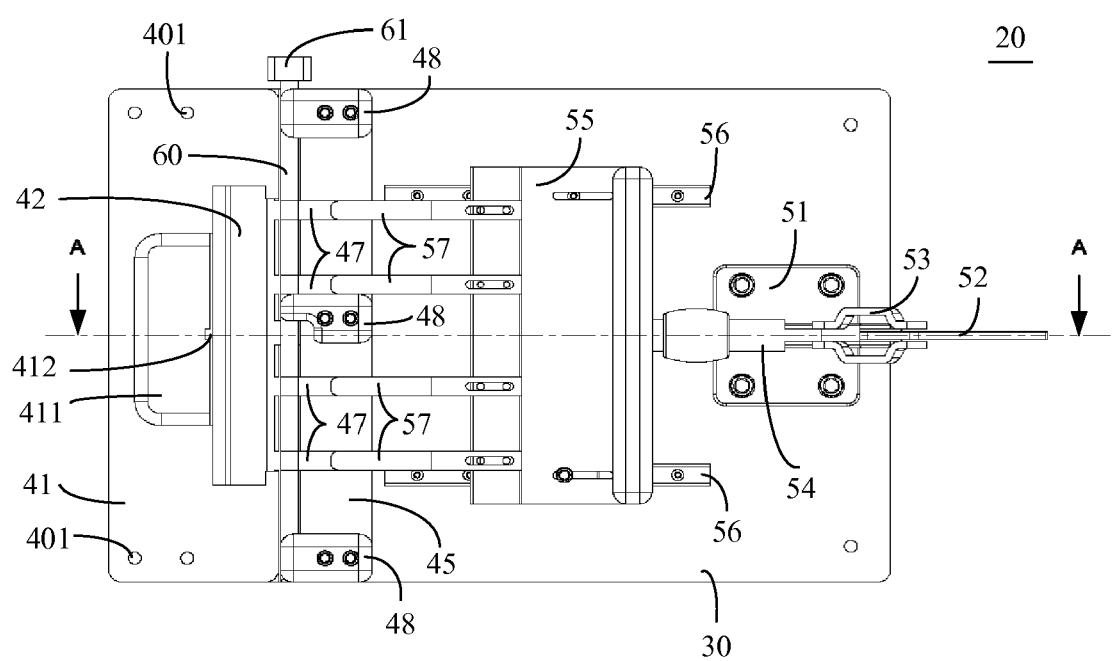
FIG. 4 is a schematic, top view of the assembling apparatus of FIG. 3.

Referring to FIGS. 3 and 4, an assembling apparatus 20 according to a preferred embodiment of the present invention is disclosed. The assembling apparatus 20 is used to assemble the memory module 10. The assembling apparatus 20 includes a base 30, an assembling platform 40, and a driving part 50.

The assembling platform 40 includes two blocks 44, 45, a cover plate 41, and a lever bar 60. The blocks 44, 45 are mounted on the base 30. The block 44 includes two poles 401. The cover plate 41 defines two holes 413 corresponding to the poles 401. The cover plate 41 can be mounted on the block 44 by engaging the holes 413 with the poles 401.

The blocks 44, 45 and the cover plate 41 define a receiving space 42. The receiving space 42 is used for receiving the memory module 10.

The blocks 44, 45 further define slots 43 on two ends of the receiving space 42. The slots 43 connect with the receiving space 42 to assist loading the memory module 10 into the receiving space 42 or to removing the memory module 10 from the receiving space 42.

The cover plate 41 further defines a depression 411 adjacent to the receiving space 42, and a second notch 412 on the edge of the depression 411. The second notch 412 is used for to assist locating the first notch 111 of the memory chip 11 in the receiving space 42.

Referring to FIG. 4, the block 45 defines a lever chamber 46 for receiving the lever bar 60, and a plurality of driving grooves 47. The lever chamber 46 is parallel to the receiving space 42. Three holder blocks 48 are mounted above the lever chamber 46 to hold the lever bar 60 along the lever chamber 46. The driving grooves 47 intersect the lever chamber 46 and connect with the receiving space 42.

Figure 5:
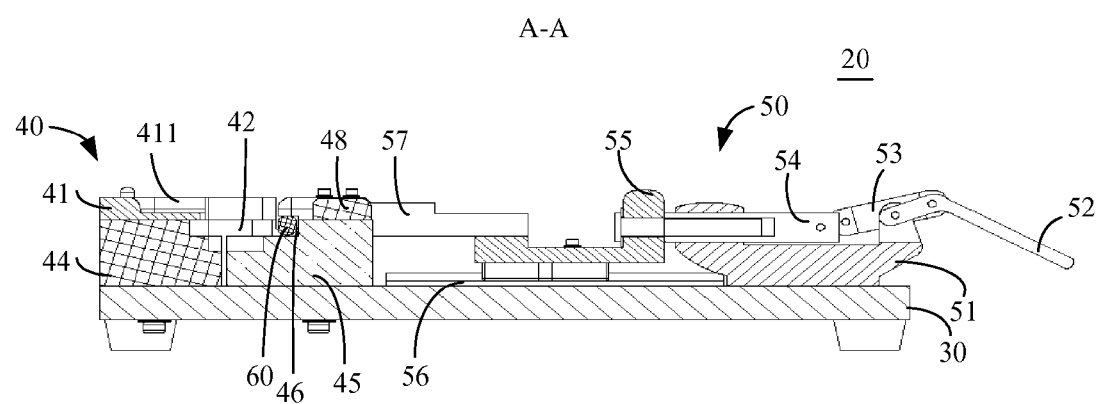
FIG. 5 is a schematic, section view of the assembling apparatus of FIG. 4.

Referring to FIGS. 4 and 5, the driving part 50 is mounted on the base 30. The driving part 50 is a crank and slide block mechanism. The driving part 50 includes a rocker 52, a crank 53, a slide shaft 54, a frame 51, a slide plate 55, two guide rails 56, and a plurality of driving shafts 57 corresponding to the clips 16. The slide shaft 54 and the slide plate 55 are fixed together. The slide plate 55 is slideably mounted on the guide rails 56. The driving shafts 57 are fixed on the slide plate 55. Ends of the driving shafts 57 are on the driving grooves 47 corresponding. If the rocker 52 is rocked, the slide plate 55 slides on the guide rails 56, and the driving shafts 57 move along the driving grooves 47 correspondingly.

Figure 6:
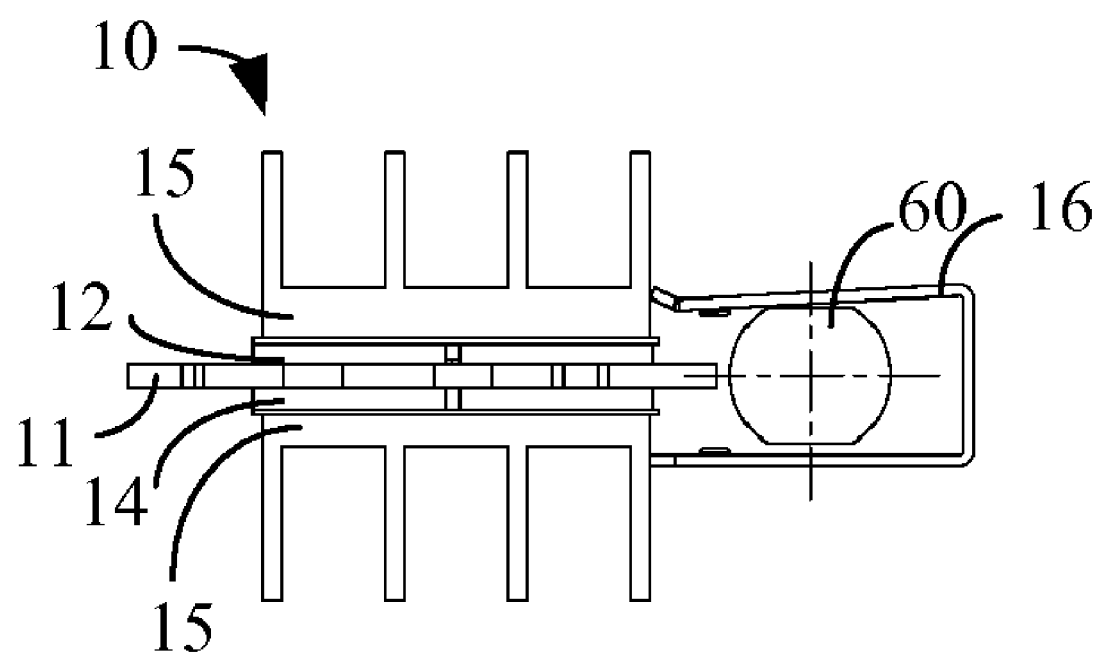
FIGS. 6-9 are schematic views of an process of assembling the memory module of FIG. 1, by utilizing the assembling apparatus of FIG. 3.
Figure 7:
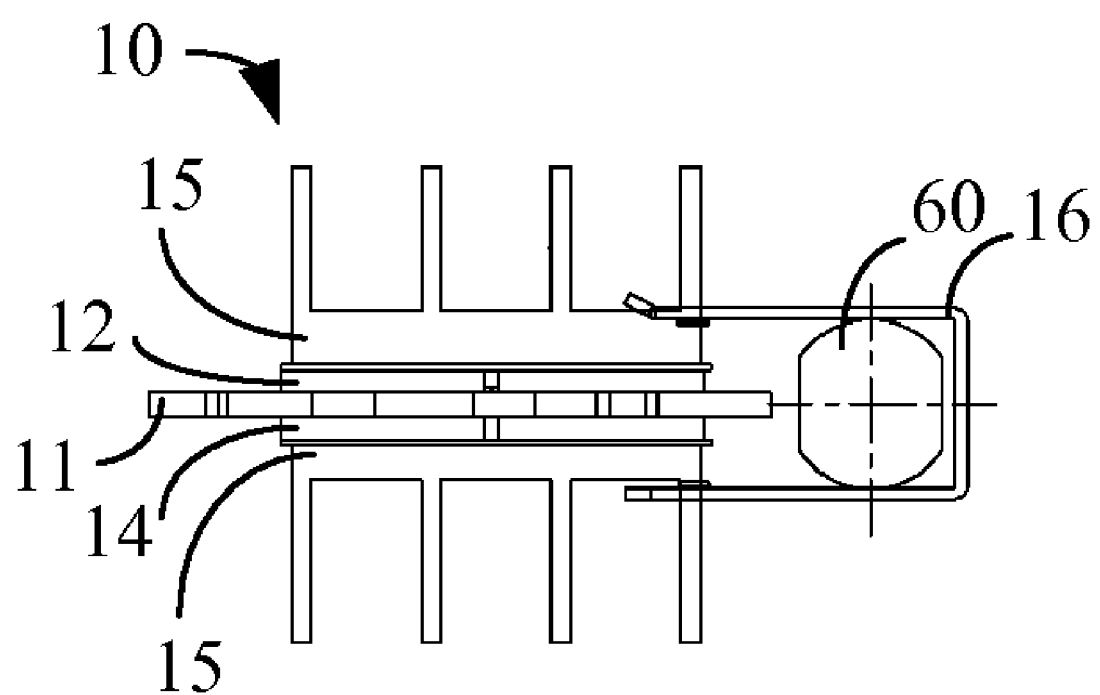
Figure 8:
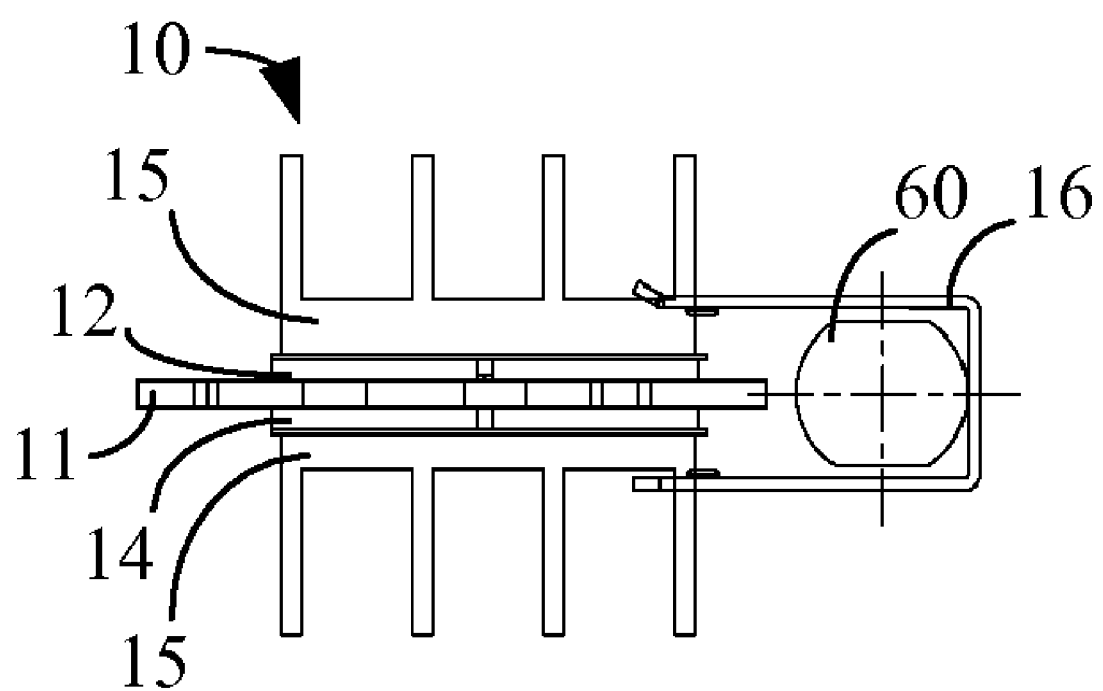
Figure 9:
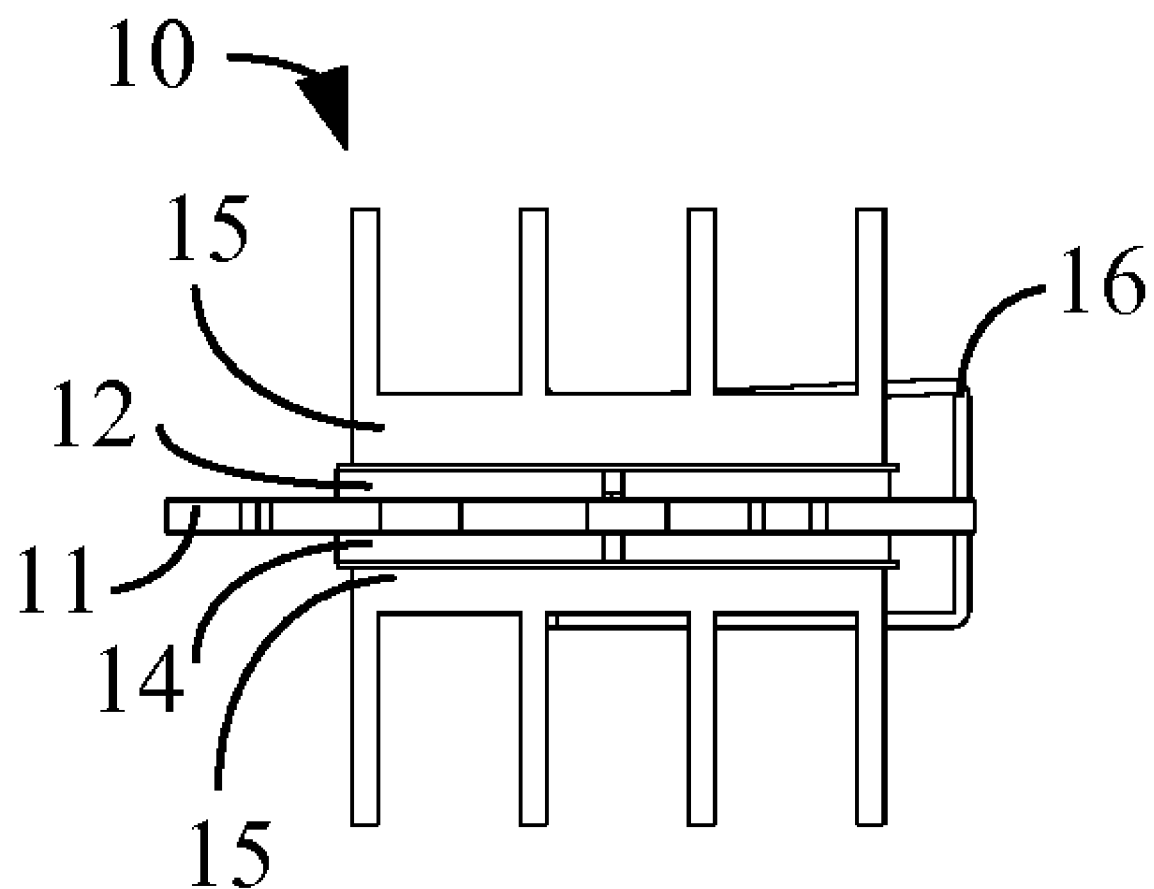

Referring to FIGS. 3, 5, and 6, a cross section of the lever bar 60 is a double flat-sided circle, and has two straight sides and two round sides. A handle 61 is mounted on an end of the lever bar 60.

For assembling the memory module 10, load the radiator 15, the heat transfer sheet 14, the memory chip 11, the heat transfer sheets 12, and the radiator 15 into the receiving space 42 in sequence. Mount the cover plate 41 on the block 44. Load the clips 16 at an intersection where the lever chamber 46 and the driving grooves 47, and align openings of the clips 16 with the receiving space 42.

Referring to FIGS. 6, 7, 8, and 9, insert the lever bar 60 into the lever chamber 46 and pass the lever bar 60 through the clips 16. At an initial position, the flat sides of the lever bar 60 contact the clips 16. Turn the lever bar 60 to expand (open) the clips 16. Partially actuate the rocker 52, the driving shafts 57 to move, thus, correspondingly pushing the clips 16 to partially engulf the radiators 15 at the fixing grooves 151. Turn the lever bar 60 to the initial position so as to enable the lever bar 60 to separate from the clips 16. Pull the lever bar 60 out from the lever chamber 46. Fully actuate the rocker 52, the driving shafts 57 move correspondingly, thus to push the clips 16 to fully engulf the radiators 15 at the fixing grooves 151. Consequently, the memory module 10 is fixed vertically.

Referring to FIGS. 1, 2, and 4, load the resilient member 17 into the fixing groove 152 of the radiator 15. Hook two ends of the resilient member 17 in the notches 111 of the memory chip 11 by nipper pliers (not shown). The memory module 10 is fixed horizontally.

Moreover, it is to be understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An assembling apparatus for assembling a semiconductor chip module, comprising:
   a base;
   an assembling platform mounted on the base, defining a receiving space for receiving the semiconductor chip module, a lever chamber for receiving clips of the semiconductor chip module, and a plurality of driving grooves for connecting the receiving space and the lever chamber, and comprising a lever bar, removably placed in the lever chamber, for expanding the clips; and
   a driving part fixed on the base, including a plurality of driving shafts, wherein an end of each of the driving shafts is in a corresponding one of the driving grooves and is movable to pass through the lever chamber and reaches the receiving space.

2. The assembling apparatus of claim 1, wherein a cross section of the lever bar is a double flat-sided circle.

3. The assembling apparatus of claim 1, wherein the driving part is a crank and slide block mechanism.

4. The assembling apparatus of claim 1, wherein the assembling platform comprises a block fixed on the base.

5. The assembling apparatus of claim 4, further comprising a cover plate removably mounted on the block.

6. The assembling apparatus of claim 5, wherein the cover plate defines a depression adjacent to the receiving space.

7. The assembling apparatus of claim 6, wherein the cover plate defines a notch on the edge of the depression.

* * * * *